United States Patent [19]

Denholm

[11] Patent Number: 5,134,299

[45] Date of Patent: Jul. 28, 1992

[54] ION BEAM IMPLANTATION METHOD AND APPARATUS FOR PARTICULATE CONTROL

[75] Inventor: A. Stuart Denholm, Lincoln, Mass.

[73] Assignee: Eaton Corporation, Cleveland, Ohio

[21] Appl. No.: 668,955

[22] Filed: Mar. 13, 1991

[51] Int. Cl.$^5$ .......................................... H01J 37/317
[52] U.S. Cl. ................................ 250/492.2; 250/398
[58] Field of Search ............... 250/492.21, 492.2, 398, 250/492.3

[56] References Cited

U.S. PATENT DOCUMENTS

| | | | |
|---|---|---|---|
| 4,703,183 | 10/1987 | Guerra | 250/492.2 |
| 4,724,325 | 2/1988 | Armstrong et al. | 250/443.1 |
| 4,736,107 | 4/1988 | Myron | 250/492.2 |
| 4,761,559 | 8/1988 | Myron | 250/492.2 |
| 4,804,837 | 2/1989 | Farley | 250/251 |
| 4,812,663 | 3/1989 | Douglas-Hamilton et al. | 250/492.2 |
| 4,883,968 | 11/1989 | Hipple et al. | 250/423 R |
| 4,914,305 | 4/1990 | Benveniste et al. | 250/492.2 |

FOREIGN PATENT DOCUMENTS

| | | | |
|---|---|---|---|
| 61-2252 | 1/1986 | Japan | 250/492.21 |
| 2098793A | 11/1982 | United Kingdom | 250/492.21 |

Primary Examiner—Jack L. Berman
Attorney, Agent, or Firm—Watts, Hoffmann, Fisher & Heinke Co.

[57] ABSTRACT

An ion beam implanter having a remote ion beam collector to reduce particulate contamination in the region of the implant chamber. A resolving magnet is activated during implantation to bend ions that exit a source to a trajectory leading to an ion implantation chamber. By de-activating the resolving magnet when not implanting, ions from the source follow a linear path to the ion beam collector.

13 Claims, 2 Drawing Sheets

ION BEAM IMPLANTATION METHOD AND APPARATUS FOR PARTICULATE CONTROL

FIELD OF THE INVENTION

The present invention concerns an ion implanter for treating one or more workpieces with an ion beam. One typical use for an ion implanter is for doping a silicon substrate or wafer to form a semi-conductor material.

BACKGROUND ART

Ion implanters having different ion beam geometries are known in the prior art. Such ion implanters cause ions from an ion source to be accelerated to high-energies and impact one or more wafers positioned within an implantation chamber until a controlled implant dosage is achieved. Generally, wafers are implanted only about one third of the time the ion source is generating the ion beam. The remaining time is spent in moving wafers to and from the implantation chamber and performing other steps to prepare the implanter for ion implantation. This means that for considerable time periods the ion beam is collected in a Faraday cup which is placed in the ion beam path in close proximity to the implantation chamber. As the ion beam impacts the Faraday cup it causes the bombarded material to disintegrate. Ion sputtering at the region of the Faraday cup also contaminates other components of the ion implanter necessitating periodic beam shut-down and component replacement or cleaning.

With the move to ever finer design rules in semiconductor fabrication, the issue of contamination of the wafer by particles during implantation ("particulate" contamination) becomes an increasingly significant problem. For example, the present specification for an advanced implanter can require that less than 8 particulates of 0.3 micron size or larger be added to a 20 cm diameter wafer during the implant cycle. It is important to limit the number of particulates generated in the beam line, since these can be transported to the wafer region by the ion beam or by pumping and venting procedures. It is consequently important to keep the regions close to the process or implantation chamber as free of particles as possible.

The ion source is not turned off when ions are not treating wafers. It takes a considerable amount of time to readjust the source each time it is shut down so that instead, the ions are directed into the Faraday cup. It has been proposed to shut down the ion source during wafer handling and other non-implant intervals. Such proposals are not practical at the present stage of source development, however, and may not be the most efficient way to avoid the problems accompanying ion sputtering onto implanter surfaces.

In the typical ion implanter, a source emits ions which are accelerated and move along an initial trajectory leading to a beam-resolving magnet. The magnet bends the ion beam, causing ions emitted by the source to follow a specific trajectory. Downstream from the magnet the ions may be further accelerated to a desired implantation energy and directed into the implantation chamber. Ions emitted from the source having an inappropriate mass follow trajectories in the magnet that remove them from the primary ion beam. These ions strike implanter walls upstream from the ion implantation chamber. Ions having the appropriate mass either impact the wafers during implantation or are otherwise directed into the Faraday cup that is moved into the ion beam just upstream from the ion implantation chamber.

DISCLOSURE OF THE INVENTION

The present invention concerns method and apparatus for managing an ion beam and has particular use in an ion implantation system. When target workpieces are not being treated the ion beam is controlled in a manner to reduce implantation chamber contamination and also reduce the frequency of repair and maintenance of the implantation system.

One well-known use for an ion implantation system is for doping silicon wafers to provide semi-conductor materials. The so-called dopant ion is emitted from the source, accelerated, and caused to impact the silicon wafer material after the beam has been mass resolved by an analyzing magnet. The magnet causes ions having an appropriate mass to follow a beam path to the ion implantation and causes other ions to exit the beam path before reaching the ion implantation station. The ion source produces ions having different masses, yet only one specific ion mass is desired for implantation so the analyzing magnet separates inappropriate mass ions from the primary beam.

One or more workpieces are supported at an ion implantation station for beam treatment. During those periods when ion implantation is not taking place, for example, when wafers are being loaded or unloaded at the implantation chamber, a control means coupled to the analysis magnet changes the field in the magnet so that the primary beam is no longer directed along the path towards the process or implantation chamber. By this change in beam path, the usage of the Faraday cup located just before the process chamber is dramatically reduced.

The easiest change in the magnetic field is to remove it so that the beam is undeflected by the magnet. In certain instances due to the geometry of the implanter, however, it may be impractical to have the beam undeflected and a modest deflection could be used. When the beam analyzing magnet is so adjusted, ions from the source are intercepted by an ion collector removed from the implantation chamber.

In accordance with a preferred embodiment of the invention, the magnet deflects the ions during implantation and is de-activated so that all ions, both those having the right mass for implantation and ions having other masses are directed along a straight line path from the source to the ion collector. An ion collector in this position can measure the ion beam while the source and its extraction geometry is adjusted for optimum operation, and can be used to confirm that source performance remains stable.

Use of an ion beam collector located some distance from the ion implantation chamber diminishes the contamination of the chamber due to ion sputtering. More specifically, during intervals when no implantation is taking place, a Faraday cup need not be positioned in the ion beam close to the implantation chamber to erode and contaminate the ion implantation chamber.

An ion implanter using the beam collector can be switched back and forth between ion implantation and a "parked" position in a matter of a few seconds. The preferred collector can be cooled by routing a coolant next to surfaces of the collector impacted by ions. This reduces erosion of the collector. Additionally, the collector can be easily disassembled for cleaning.

The collector can also be used to monitor ion beam current and can calibrate ion beam performance prior to implantation. During those time intervals when implantation is not occurring, ion beam current can be significantly reduced to a percentage of the implantation current. After wafer-handling steps have been performed to unload and load the wafers, the current is again increased to implantation levels and the magnet again turned on to bend ions having the proper mass back to the implantation trajectory.

From the above, it is seen that one object of the invention is an improved ion implantation configuration designed to reduce particle contamination in the vicinity of the ion implantation chamber, while improving maintainability of the ion implantation system. Other objects, advantages and features of the invention will become better understood from the detailed description of one embodiment of the invention which is described in conjunction with the accompanying drawings.

BEST MODE FOR PRACTICING THE INVENTION

Figure 1:
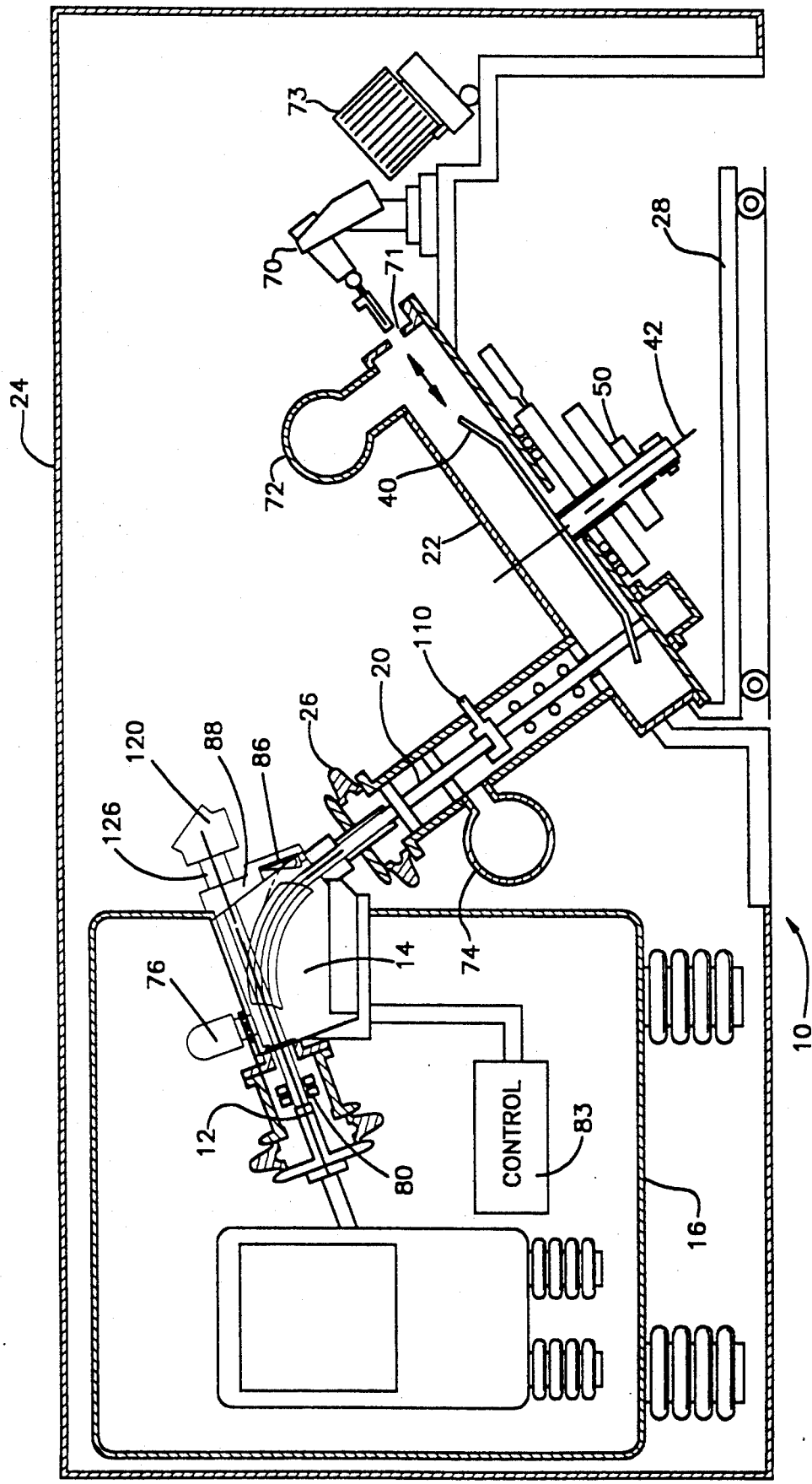
FIG. 1 is a schematic depiction of an ion implanter for directing an ion beam to impact a workpiece such as a silicon wafer.

Turning now to the drawings, FIG. 1 depicts an ion implantation system 10 having an ion source 12 and a beam analyzing magnet 14 contained within a high-voltage housing 16. An ion beam 20 emanating from the source 12 follows a controlled travel path that exits the housing 16 and enters an ion implantation chamber 22 positioned inside a second housing 24. The analyzing magnet 14 causes only those ions having an appropriate mass to form the ion beam 20. Along the travel path from the housing 16 to the chamber 22, the ion beam 20 passes through a high-voltage isolation bushing 26 that connects the magnet 14 with the implantation chamber 22.

The ion implantation chamber 22 is supported on a movable pedestal 28. This allows the chamber 22 to be aligned relative to the ion beam. The ion beam impinges upon a wafer support 40 mounted for rotation about an axis 42. The wafer support 40 supports multiple silicon wafers around its outer periphery and moves those wafers along a circular path so that the ion beam 20 impacts each of the wafers and selectively dopes those wafers with ion impurities. High speed rotation of the support 40 is effected by a motor 50 which rotates the support 40 after wafers have been positioned on the support.

Additional details concerning an ion implantation system are contained in U.S. Pat. No. 4,672,210 to Armstrong et al. The subject matter of this prior art patent is incorporated herein by reference.

Semiconductor wafers are inserted into the ion implantation chamber 22 by a robotic arm 70 through a vacuum port 71. The chamber 22 is evacuated by a vacuum pump 72 to the same pressure as the pressure along the ion beam path. The robotic arm 70 transfers wafers back and forth between a cassette 73 for storing the wafers. Mechanisms for accomplishing this transfer are well known in the prior art. Two additional pumps 74, 76 evacuate the ion beam path from the source 12 to the implantation chamber 22.

Figure 2:
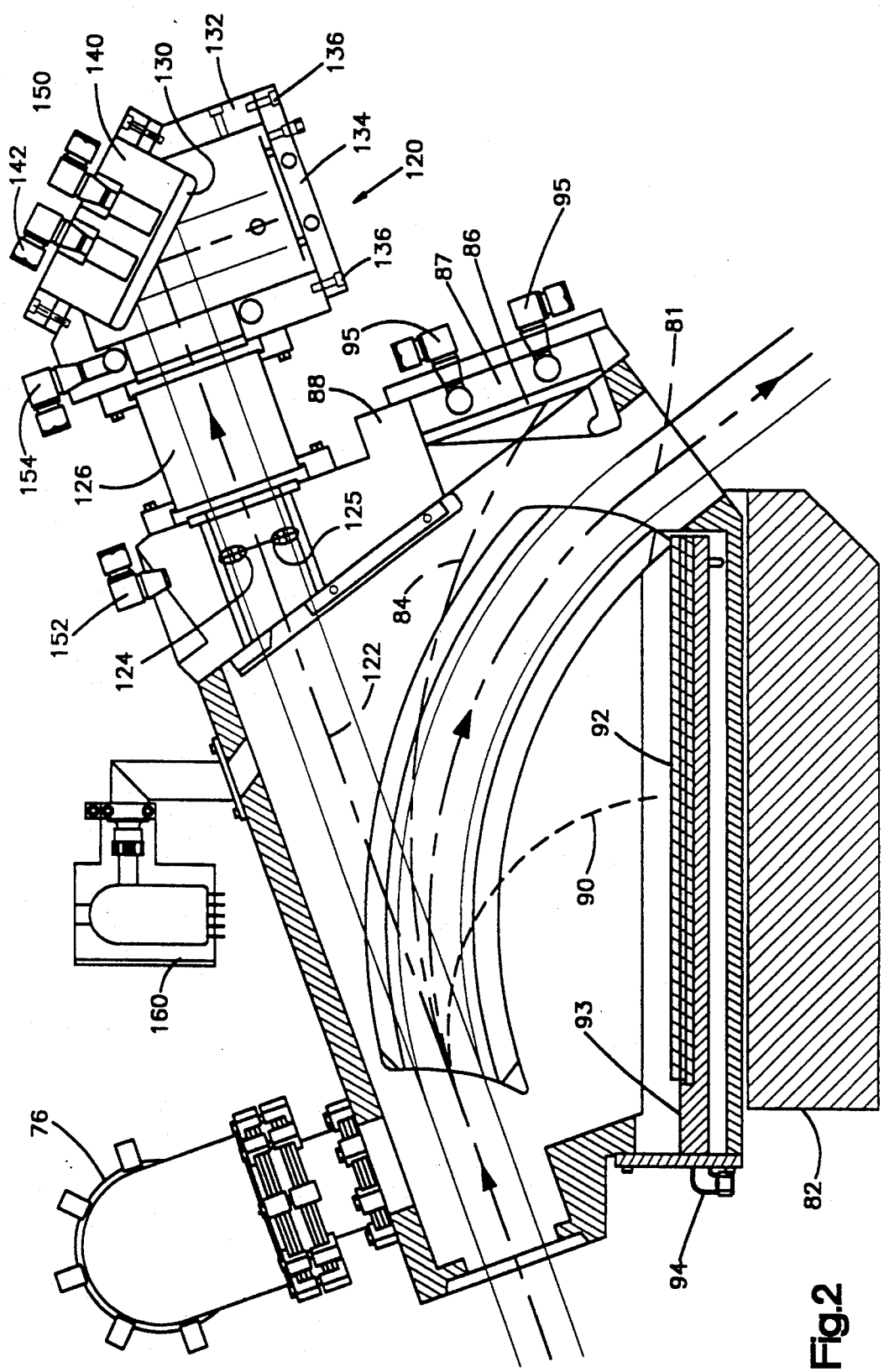
FIG. 2 is an enlarged plan view of an ion beam resolver or analysis magnet and associated ion beam collector or beam dump.

As seen in FIGS. 1 and 2, ions exiting the source 12 move along a generally straight line path into the magnet 14. As they exit the source the ions are accelerated by electric fields set up by extraction electrodes 80 positioned outside a source exit aperture. The analyzing magnet 14 produces a magnetic field through which the ions pass after they exit the source 12. This magnetic field bends ions to a normal implant trajectory 81 so that ions of the appropriate mass exit the analyzing magnet and may be further accelerated along a travel path leading to the implantation chamber. A magnet yoke 82 is seen in section and is bounded by field windings that are not seen in FIG. 2. An implanter control 83 situated within the housing 16 adjusts the magnet field strength by controlling current in the magnet's field windings.

The source 12 produces a larger fraction of ions having a mass different from the ions used for implantation. These unwanted ions are not bent by the analyzing magnet 14 through the same path as implantation ions and are therefore separated from the implantation trajectory. Heavy ions follow the trajectory 84, for example, depicted in FIG. 2, and strike a target 86 attached to a magnet housing end plate 88. Since these higher mass ions strike the plate 86 at a position well removed from the ion implantation chamber 22, they are much less likely to contaminate the implantation chamber.

Ions that are lighter than those used for implantation follow a tighter radius trajectory 90 and strike a target 92. Both the targets 86, 92 tend to heat up as they are bombarded with ions. A coolant for dissipating heat is routed through supports 87, 93 for the plates 86, 92 via couplings 94, 95.

Turning to FIG. 1, a Faraday cup 110 is shown positioned along the beam travel path after the ions exit the magnet 14. In the prior art, when ion implantation was suspended, the magnet 14 continued to bend ions from the source 12 toward the implantation chamber 22. The Faraday cup 110 was used to intercept these ions and prevent them from reaching the implantation chamber 22.

In accordance with the disclosed embodiment of the ion implantation system, the Faraday cup 110 is used only during beam set-up. More specifically, it is used to monitor ion beam current. The Faraday cup 110 is not used to intercept ions during other time intervals.

A beam collector 120 is positioned to collect ions moving along a straight line path from the source 12. During intervals when the ion beam 20 is not used for treating wafers, the magnet is turned off by the control 83. The magnet 14 can be rapidly de-activated by switching off current to its windings. Those ions passing through the magnet 14 without deflection follow a straight line path 122 through an annular graphite diaphragm 124 that defines an aperture 125. A valve 126 can be opened and closed to provide access to the collector 120 for cleaning, etc. without affecting the vacuum maintained along the ion beam travel path by the pumps 72, 74, 76.

The ions that pass through the valve 126 strike a cooled target plate 130. Ion beam current striking the plate 130 is monitored by a monitoring circuit within the implanter control 83 to check on beam stability or for beam adjustment prior to resuming the implant cycle. Monitoring circuits for monitoring beam current are known in the prior art and are used, for example, in monitoring current impinging on the Faraday cup 110.

The target plate 130 slowly disintegrates because of sputtering, or related effects, and most of the resulting debris collects in a container 132. A removable wall 134 attached to the container 132 by, for example, threaded connectors 136 can be removed to facilitate cleaning.

The target plate 130 is cooled by routing suitable cooling fluids such as water into a target housing 140 by means of a coupling 142. The coolant is forced through the housing into a region close to the target plate 130 where the coolant exchanges heat with the housing. Heat generated by the ion beam as it collides with the target plate 130 is removed by the coolant and is routed away from the housing via an exit conduit through a coupling 150. Additional couplings 152, 154 route coolant through the magnet housing end plate 88 and ion collector container 132.

In proximity to the region of the collector 120, the magnet 14 supports an ion gauge 160 used to monitor pressure along the beam line. As noted above, the beam line evacuation may be maintained by closing the valve 126 as the collector 120 is cleaned. Since the strike plates 86, 92 are attached to the magnet housing, replacement of these plates does, however, require pressurization of the beam line.

A preferred ion beam implanter and method of operating an ion beam implanter to reduce contamination of the implanter process chamber have been described. It should be appreciated that alterations and modifications from the preferred designs are possible. It is the intent that the invention encompass all such alterations and modifications falling within the spirit or scope of the appended claims.

I claim:

1. Ion implantation apparatus comprising:
   a) an ion source that emits ions along a first beam path;
   b) a beam resolver for causing ions having an appropriate mass to follow a second beam path for implantation of one or more wafers at an ion implantation station;
   c) workpiece support structure for supporting the one or more wafers at the ion implantation station;
   d) an ion collector near the first beam path for intercepting both those ions having appropriate mass and other ions emitted from the ion source from the source during time periods when wafers are not being treated; and
   e) a control coupled to the beam resolver for activating the beam resolver during implantation periods when wafers are being treated and adjusting the beam resolver during time periods when wafers are not being treated to cause the ions emitted from the ion source to travel toward the ion collector.

2. The ion implantation apparatus of claim 1 wherein the beam resolver comprises a magnet having a field strength adjustable by the control for deflecting the ions of the appropriate mass toward the ion implantation station during implantation periods and for directing the ions of appropriate mass toward the ion collector during time periods when wafers are not being treated.

3. The ion implantation apparatus of claim 1 wherein the ion collector comprises a sensor for measuring ion current reaching the ion collector for calibrating ion beam performance.

4. The ion implantation apparatus of claim 3 wherein the ion collector comprises a removable sensor cooled by a liquid coolant routed to the removable sensor for dissipating heat energy caused by ion impact with the removable sensor.

5. The ion implantation apparatus of claim 1 comprising structure defining an evacuated beam transport region from the ion source to the workpiece support structure, means for maintaining said beam transport region at a reduced pressure, and valve means for separating the ion collector from the evacuated beam transport region to allow the ion collector to be disassembled without pressurizing the evacuated beam transport region.

6. A method of implanting one or more target wafers with controlled concentrations of ions comprising the steps of:
   a) positioning one or more wafers at an implantation station to allow ions moving along an implantation trajectory to impact said one or more wafers;
   b) causing ions emitted from an ion source to move along an initial trajectory;
   c) generating a magnetic field to divert ions of an appropriate mass from the initial trajectory to the implantation trajectory;
   d) adjusting the magnetic field to cause the ion beam to impact an ion collector remote from the implantation station when ion implantation is suspended; and
   e) while the ion beam is impacting the ion collector, unloading said one or more wafers and loading an additional one or more wafers for implantation by the ion beam.

7. The method of claim 6 wherein the magnetic field is adjusted to allow the ions to follow the initial trajectory into the ion collector during those time periods ion implantation is suspended.

8. The method of claim 6 wherein the positioning step comprises the steps of moving said one or more wafers into an implantation chamber, supporting said one or more wafers for movement and periodically moving said one or more wafers along a path which causes them to be impacted by ions from the ion source.

9. Ion implantation apparatus comprising:
   a) an ion source for emitting ions used in treating wafers at an ion implantation station;
   b) acceleration means for accelerating ions from the ion source along a first travel path;
   c) an analyzing magnet for diverting ions of an appropriate mass from the first travel path to an implantation trajectory leading to the ion implantation station and for deflecting other ions to non-implantation trajectories;
   d) workpiece support structure for supporting the one or more wafers at the ion implantation station;
   e) ion collector means positioned outside the implantation trajectory for intercepting both ions of the appropriate mass and the other ions from the source; and
   f) a control coupled to the analyzing magnet for adjusting the magnetic field produced by the analyzing magnet when wafers are not being treated to cause both ions of appropriate mass and the other ions from the source to travel toward the ion collector means.

10. The ion implantation apparatus of claim 9 wherein the control means de-activates the analyzing magnet to allow all ions to follow the first travel path when wafers are not being treated and wherein the ion collector means includes structure aligned to intercept ions moving along the first travel path.

11. The ion implantation apparatus of claim 10 wherein the structure aligned to intercept ions moving along the first travel path comprises a detachable container having a target plate to intercept ions and further comprising means for monitoring ion beam current striking the target plate.

12. A method of implanting target wafers with controlled concentrations of ions comprising the steps of:
 a) causing ions to be emitted from an ion source along an initial trajectory at an implantation ion beam current level;
 b) positioning one or more target wafers at an implantation station for implantation by ions diverted from the initial trajectory;
 c) generating, for a finite period of time, an electromagnetic field to divert ions of appropriate mass from the initial trajectory toward the first one or more target wafers;
 d) at the end of the finite period of time,
  i) adjusting the magnetic field to cause the ions emitted from the ion source to impact an ion collector remote from the implantation station; and
  ii) reducing the ion beam current from the ion source below the implantation current level; and
 e) removing the one or more target wafers and positioning one or more additional wafers at the implantation station while the ions emitted from the ion source are being caused to impact on the ion collector.

13. The method of claim 12 wherein the magnetic field is generated during the finite period time by means of a magnetic field source which is turned off at the end of the finite period of time so that the ions emitted from the ion source impact the ion collector along the initial trajectory.

* * * * *